United States Patent
Lee et al.

(10) Patent No.: US 7,799,648 B2
(45) Date of Patent: Sep. 21, 2010

(54) METHOD OF FORMING A MOSFET ON A STRAINED SILICON LAYER

(75) Inventors: Sun-Ghil Lee, Seongnam-si (KR); Young-Pil Kim, Suwon-si (KR); Yu-Gyun Shin, Seongnam-si (KR); Jong-Wook Lee, Yongin-si (KR); Young-Eun Lee, Goyang-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/478,345

(22) Filed: Jun. 4, 2009

(65) Prior Publication Data

US 2009/0239348 A1    Sep. 24, 2009

Related U.S. Application Data

(62) Division of application No. 11/398,118, filed on Apr. 5, 2006, now Pat. No. 7,557,388.

(30) Foreign Application Priority Data

Apr. 6, 2005    (KR) .................. 10-2005-0028643

(51) Int. Cl.
*H01L 21/336* (2006.01)
(52) U.S. Cl. ............... 438/285; 438/296; 257/E21.085; 257/E21.09; 257/E21.54
(58) Field of Classification Search ............... 438/285, 438/296; 257/E21.085, E21.09, E21.54
See application file for complete search history.

(56) References Cited

U.S. PATENT DOCUMENTS 6,429,061 B1    8/2002    Rim 7,229,864 B2    6/2007    Tanaka
7,456,057 B2    11/2008   Gadkaree et al.
7,553,732 B1 *  6/2009    Brown et al. ................. 438/300
2003/0057416 A1  3/2003    Currie et al.

FOREIGN PATENT DOCUMENTS

| JP | 10270685   | 10/1998 |
|----|------------|---------|
| JP | 2000031491 | 1/2000  |
| JP | 2002094060 | 3/2002  |
| JP | 2002289533 | 10/2002 |

OTHER PUBLICATIONS

Application and Prosecution history of U.S. Appl. No. 11/398,118, filed Apr. 6, 2005, by Sun-Ghil Lee, et al. entitled "A MOSFET Formed on a Strained Silicon Layer".

* cited by examiner

*Primary Examiner*—Ngan Ngo
(74) *Attorney, Agent, or Firm*—Mills & Onello, LLP

(57) ABSTRACT

A semiconductor device formed on a strained silicon layer and a method of manufacturing such a semiconductor device are disclosed. In accordance with this invention, a first silicon germanium layer is formed on a single crystalline silicon substrate; a second silicon germanium layer is formed on the first silicon germanium layer, the second silicon germanium layer having a concentration of germanium in a range of about 1 percent by weight to about 15 percent by weight based on the total weight of the second silicon germanium layer; a strained silicon layer is formed on the second silicon germanium layer; an isolation layer is formed at a first portion of the strained silicon layer; a gate structure is formed on the strained silicon layer; and, source/drain regions are formed at second portions of the strained silicon layer adjacent to the gate structure to form a transistor.

8 Claims, 6 Drawing Sheets

METHOD OF FORMING A MOSFET ON A STRAINED SILICON LAYER

RELATED APPLICATIONS

This application is a divisional of U.S. application Ser. No. 11/398,118, filed on Apr. 5, 2006, which relies for priority upon Korean Patent Application No. 2005-28643, filed on Apr. 6, 2005, the contents of which are herein incorporated by reference in their entirety.

BACKGROUND OF THE INVENTION

1. Field of the Invention

Exemplary embodiments of the present invention relate to semiconductor devices and methods of manufacturing such semiconductor devices. More particularly, exemplary embodiments of the present invention relate to semiconductor devices formed on a strained silicon layer and methods of manufacturing such semiconductor devices.

2. Description of the Related Art

Recently, semiconductor devices have experienced rapid development as information media, such as computers, have become widespread. Semiconductor devices that operate with a high response speed and a large storage capacity are in demand. In order to meet these requirements, the manufacturing technology for fabricating semiconductor devices has been developed to improve integration degree, reliability, response speed, etc.

A transistor, such as a metal oxide semiconductor field effect transistor (MOSFET), is well known as one of the principal semiconductor devices. A current transistor may be operated with a high response speed at a low voltage, and the technology for manufacturing such a transistor has developed to improve an integration degree of such a transistor and to reduce a size dimension of such a transistor.

To obtain a transistor of a high response speed, a transistor having a channel region formed in a strained silicon layer of the transistor has been developed. Such a transistor may have an enhanced mobility of electrons or holes. The term "strained silicon layer" as used herein means a silicon layer in which a normal bonding distance between silicon atoms comprising such layer may be either extended or compressed in accordance with a lattice parameter of an underlayer positioned beneath the silicon layer. When a channel is formed in such a tensile-strained silicon layer, mobility of electrons or holes may be improved so that a P-type metal oxide semiconductor (PMOS) or an N-type metal oxide semiconductor (NMOS) may be advantageously formed on the tensile-strained silicon layer. Thus, the use of a strained silicon layer has been widely researched as one technique to obtain a transistor having a high response speed. This strained silicon layer may be formed through various methods.

In one method for forming a strained silicon layer, the strained silicon layer may be formed by adjusting a stress generated therein. For example, a strained silicon layer can be formed using a tensile stress generated in an interface between a silicon substrate and a nitrate layer formed on the silicon substrate.

According to another method for forming a strained silicon layer, the strained silicon layer may be grown on a silicon germanium layer after the silicon germanium layer is formed on a semiconductor substrate. Because the strained silicon layer is grown on the silicon germanium layer, which has a lattice parameter that is relatively larger, the bonding distance between silicon atoms in the strained silicon layer may be larger than between silicon atoms of a conventional single crystalline silicon layer. Here, lattice mismatches of the silicon germanium layer may be increased in accordance with an increase in the content of germanium in the silicon germanium layer, so that the bonding distance between the silicon atoms in the strained silicon layer may be further increased by increasing the germanium content of the silicon germanium layer.

When a strained silicon layer having a relatively greater thickness is formed on a silicon germanium layer having a relatively high content of germanium, a stress in the strained silicon layer may be considerably increased. In fact, in some instances where the stress in a strained silicon layer is increased to beyond a certain limiting point, a strain relaxation may subsequently occur in the strained silicon layer as a result of a crystalline structure of the strained silicon layer being broken. Also, when the content of germanium of the silicon germanium layer is about 30 percent by weight based on the total weight of the silicon germanium layer, the strained silicon layer may be grown on the silicon germanium layer to a relatively great thickness ranging from several tens angstroms to as much as several hundreds of angstroms. In such cases, an isolation layer or source/drain regions of a transistor should be extended completely through the strained silicon layer to the silicon germanium layer.

Since the silicon germanium layer has different characteristics from those of the strained silicon layer relative to an etching process, a cleaning process, a diffusion process, etc., a failure of the transistor may easily occur in the course of forming an isolation layer or the source/drain regions. Additionally, the aforementioned fabrication processes may be complicated because those processes should normally be carried out taking into account the etching, cleaning and diffusion characteristics of the silicon germanium layer and the strained silicon layer while forming the isolation layer and/or the source/drain regions.

As the lattice mismatches of the silicon germanium layer are increased, the stress in the strained silicon may be also augmented, and thus defects in the strained silicon layer may be increased. When the defects of the strained silicon layer are thus augmented, a leakage current from the transistor may be increased and reliability of the transistor may thereby be lowered.

Some methods of forming transistors on strained silicon layers are disclosed in Japanese Laid-Open Patent Publications No. 2002-094060 and No. 2000-031491, which disclosures are incorporated herein by reference. In a method of the Japanese Laid-Open Patent Publication No. 2002-094060, a transistor is formed on a strained silicon layer positioned on a silicon germanium layer after an isolation layer and a well region are formed in the silicon germanium layer. Because an etching rate of the silicon germanium layer may be very high when the silicon germanium layer has lattice defects, the isolation layer may not be properly formed due to a difficulty in performing uniform etching of the silicon germanium layer. Further, an impurity concentration of the well region may not be properly adjusted because impurities may be rapidly diffused into the silicon germanium layer during an ion implantation process for forming the well region.

A transistor according to Japanese Laid-Open Patent Publication No. 2000-031491 has an isolation layer extending to a buried oxide layer (BOX) in a substrate. However, an etching process for forming the isolation layer may not be easily performed when the isolation layer extends to the BOX in the substrate. That is, a strained silicon layer, and a silicon germanium layer beneath the strained silicon layer, are typically etched together during the etching process for forming the isolation layer, so that the etching process may be complicated, and a trench for the isolation layer may not have a desired profile. Additionally, adjacent transistors are completely separated from each other such that a semiconductor device including such adjacent transistors may be deteriorated by self-heating of the transistors during an operation used in fabricating the semiconductor device.

These and other problems with and limitations of the prior art techniques are addressed in whole, or at least in part, by the devices and methods of this invention.

SUMMARY OF THE INVENTION

Exemplary embodiments of the present invention provide semiconductor devices that are embodied on strained silicon layers and which demonstrate good, reliable performance.

Exemplary embodiments of the present invention also provide methods of manufacturing semiconductor devices that are embodied on strained silicon layers and which demonstrate good, reliable performance.

According to one aspect of the present invention, there is provided a semiconductor device including a first silicon germanium layer formed on a single crystalline silicon substrate, a second silicon germanium layer formed on the first silicon germanium layer, a strained silicon layer formed on the second silicon germanium layer, an isolation layer formed at a first portion of the strained silicon layer, a gate structure formed on the strained silicon layer, and source/drain regions formed at second portions of the strained silicon layer adjacent to the gate structure. The first silicon germanium layer may have a concentration gradient of germanium. The second silicon germanium layer may have a concentration gradient of germanium in a range of about 1 percent by weight to about 15 percent by weight based on the total weight of the second silicon germanium layer.

In accordance with one exemplary embodiment of the present invention, a concentration of germanium in the first silicon germanium layer may gradually increase from a lower portion of the first silicon germanium layer to an upper portion of the first silicon germanium layer.

In accordance with another exemplary embodiment of the present invention, the concentration of germanium at a top portion of the first silicon germanium layer may be substantially the same as that throughout the second silicon germanium layer.

In accordance with still another exemplary embodiment of the present invention, the strained silicon layer may have a thickness of about 1,000 Å to about 5,000 Å.

In accordance with yet another exemplary embodiment of the present invention, the source/drain regions may have junction depths substantially smaller than a thickness of the strained silicon layer.

In accordance with still another exemplary embodiment of the present invention, the isolation layer may have a thickness that is less than about 90% of a thickness of the strained silicon layer.

According to one aspect of the present invention, there is provided a method of manufacturing a semiconductor device. In this method of manufacturing a semiconductor device, a first silicon germanium layer is formed on a single crystalline silicon substrate. The first silicon germanium layer has a concentration gradient of germanium forming a second silicon germanium layer on the first silicon germanium layer, wherein the second silicon germanium layer has a concentration gradient of germanium in a range of about 1 percent by weight to about 15 percent by weight based on the total weight of the second silicon germanium layer. The steps of this method include: forming a strained silicon layer on the second silicon germanium layer; forming an isolation layer at a first portion of the strained silicon layer; forming a gate structure on the strained silicon layer; and forming source/drain regions at second portions of the strained silicon layer adjacent to the gate structure.

In accordance with one exemplary embodiment of the present invention, the first silicon germanium layer is formed by an epitaxial growth process such that a concentration of germanium in this first silicon germanium layer gradually increases from a lower portion of the first silicon germanium layer to an upper portion of the first silicon germanium layer.

In accordance with another exemplary embodiment of the present invention, the concentration of germanium in a top portion of the first silicon germanium layer may be substantially the same as that throughout the second silicon germanium layer.

In accordance with still another exemplary embodiment of the present invention, the source/drain regions may be formed by an ion implantation process so as to have junction depths substantially smaller than a thickness of the strained silicon layer.

In accordance with yet another exemplary embodiment of the present invention, the strained silicon layer may have a thickness of about 1,000 Å to about 5,000 Å.

In accordance with still another exemplary embodiment of the present invention, the isolation layer may be formed by steps of: (a) forming a buffer oxide layer pattern and a hard mask pattern on the strained silicon layer; (b) forming a trench at an upper portion of the strained silicon layer by partially etching the strained silicon layer using the hard mask pattern as an etching mask; and (c) forming the isolation layer to fill up the trench.

In accordance with still another exemplary embodiment of the present invention, the strained silicon layer may be cleaned using a cleaning solution after an isolation layer has been formed, for example, as described above.

In accordance with yet another exemplary embodiment of the present invention, the isolation layer may be formed to have a thickness that is less than about 90% of a thickness of the strained silicon layer.

According to some further exemplary embodiments of the present invention, an isolation layer may be formed at a predetermined portion of the strained silicon layer such that the second silicon germanium layer is not exposed during formation of the isolation layer. Thus, an etching process for forming the isolation layer may be easily carried out without concern about possible damage to the second silicon germanium layer, or about possible failure of the semiconductor device as a result of adjusting a thickness of the isolation layer. As a result, a yield of the semiconductor device may be improved and also electrical characteristics and reliability of the semiconductor device may be enhanced.

BRIEF DESCRIPTION OF THE DRAWINGS

The above and other features and advantages of the present invention will become more apparent in the following detailed description of exemplary embodiments thereof with reference to the accompanying drawings, in which.

DESCRIPTION OF PREFERRED EMBODIMENTS

Figure 1:
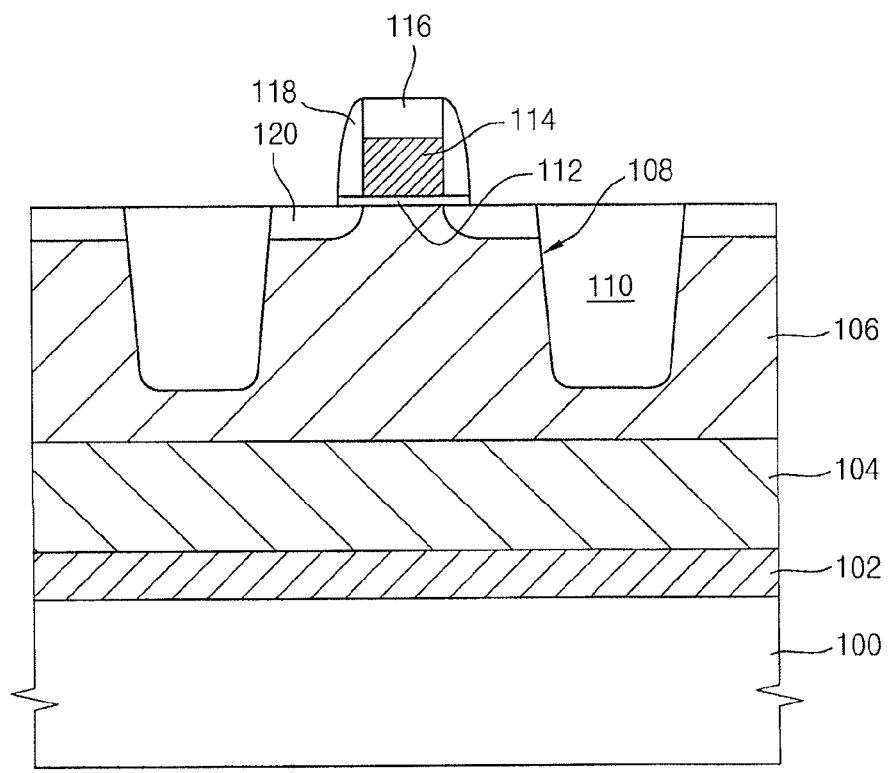
FIG. 1 is a schematic cross-sectional view illustrating a semiconductor device formed in accordance with an exemplary embodiment of the present invention.

The present invention is described more fully hereinafter with reference to the accompanying drawings, in which exemplary embodiments of the present invention are shown. It will be understood that the present invention may, however, be embodied in many different forms and should not be construed as limited to the exemplary embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will also be understood that, when an element or layer is referred to as being "on", "connected to" or "coupled to" another element or layer, it can be directly on, connected or coupled to the other element or layer or, alternatively, intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be further understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could, alternatively, be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood, however, that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have slightly rounded or curved features and/or a gradient of implant concentration at its edges rather than a sharply delineated binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of an actual device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

FIG. 1 is a schematic cross-sectional view illustrating a semiconductor device formed in accordance with an exemplary embodiment of the present invention.

Referring to FIG. 1, a first silicon germanium layer 102 having a concentration gradient of germanium is formed on a single crystalline silicon substrate 100. The first silicon germanium layer 102 may have the concentration gradient of germanium and be referred to as, a "graded silicon germanium layer". Particularly, the concentration of germanium in the first silicon germanium layer 102 may gradually increase from a very low level, such as substantially zero, in a lower portion of the first silicon germanium layer 102 to a higher concentration in an upper portion of the first silicon germanium layer 102. The concentration of germanium at a top portion of the first silicon germanium layer 102 may be in a range of about 1 percent by weight to about 15 percent by weight based on the total weight of the first silicon germanium layer 102. For example, the concentration of germanium at the top portion of the first silicon germanium layer 102 may be in a range of about 5 percent by weight to about 10 percent by weight.

Because the first silicon germanium layer 102 has the concentration gradient of germanium, lattice dislocations may occur in the first silicon germanium layer 102 in accordance with lattice mismatches between the first silicon germanium layer 102 and the single crystalline silicon substrate 100. However, because the concentration of germanium in the first silicon germanium layer 102 in exemplary embodiments of the present invention, particularly germanium concentrations in the lower region of layer 102, may be substantially lower than corresponding concentrations of germanium in a conventional semiconductor device, the lattice dislocations in the first silicon germanium layer 102 may be reduced to acceptable levels.

A second silicon germanium layer 104 is formed on the first silicon germanium layer 102. The second silicon germanium layer 104 should not have a concentration gradient of germanium therein. The second silicon germanium layer 104 may be referred to as a "relaxed silicon germanium layer."

The second silicon germanium layer 104 may have a lattice parameter that is substantially the same as that of an upper portion of a layer serving as a seed layer for forming the second silicon germanium layer 104. That is, the concentration of germanium in the second silicon germanium layer 104 may be substantially the same as that of the top portion of the first silicon germanium layer 102. Thus, the content of germanium in the second silicon germanium layer 104 may be in a range of about 1 percent by weight to about 15 percent by weight based on the total weight of the second silicon germanium layer 104. Because the second silicon germanium layer 104 may be formed on the seed layer under a condition in which a lattice space thereof may be sufficiently ensured (i.e., a space in which a lattice of the second silicon germanium layer 104 may grow), lattice mismatches between an upper portion and a lower portion of the second silicon germanium layer 104 may be avoided or minimized.

A strained silicon layer 106 is next formed on the second silicon germanium layer 104. A lattice parameter of the strained silicon layer 106 may be substantially larger than a lattice parameter of a layer including typical single crystalline silicon. Thus, a bonding distance between silicon atoms in the strained silicon layer 106 may be substantially larger than a distance between silicon atoms in the layer including typical single crystalline silicon.

When the strained silicon layer 106 has a thickness above about 5,000 Å, however, a crystalline structure of silicon in the strained silicon layer may be damaged, and a process time for forming such a thick strained silicon layer 106 may be greatly increased. On the other hand, when the strained silicon layer 106 has a thickness below about 1,000 Å, a thickness of an isolation layer 110 selectively formed on such a strained silicon layer 106 may also be decreased such that electrical isolations of elements in the semiconductor device may not be properly achieved. Thus, the strained silicon layer 106 preferably will have a thickness ranging from about 1,000 Å to about 5,000 Å. In order to further ensure proper electrical isolations of the elements in the semiconductor device, the strained silicon layer 106 may more preferably have a thickness of about 3,000 Å to about 5,000 Å.

When the concentration of germanium in the second germanium silicon layer 104 is increased to the high end of the recited 1 to 15 weight-percent range, i.e., to about 15 percent by weight, the thickness of the strained silicon layer 106 that is formed on layer 104 may be reduced such that the resulting strained silicon layer 106 may only have a thickness of about 1,000 Å, i.e., at the low end of the recited thickness range. On the other hand, when the concentration of germanium in the second silicon germanium layer 104 is decreased to the low end of the range, i.e., about 1 percent by weight, the thickness of the strained silicon layer 106 that is formed may be augmented to about 5,000 Å, i.e., at the high end of the recited thickness range. In one specific example, the thickness of the strained silicon layer 106 that was formed was about 4,000 Å when the concentration of germanium in layer 104 was about 5 percent by weight.

Next, an isolation layer 110 is formed at a first portion (or first portions) of the strained silicon layer 106. As seen in FIG. 1, in a first step, a trench (or trenches) 108 for electrically isolating the elements is formed at the first portion(s) of the strained silicon layer 106 so as to define an isolation region of the layer 106. The isolation region of the layer 106 means a portion of the layer 106 isolated by the trench. When the trench 108 has a depth that is greater than about 90% of the thickness of the strained silicon layer 106, the second silicon germanium layer 104 may be exposed through a bottom portion of the trench 108 because a process margin for forming the trench 108 may be insufficient to protect the layer 104. Therefore, the depth of the trench 108 in the strained silicon layer 106 should preferably be controlled so as to be less than about 90% of the thickness of the strained silicon layer 106.

As seen in FIG. 1, next, the isolation layer 110 is formed in the trench 108. Thus, a thickness of the isolation layer 110 should preferably be controlled so as to be less than about 90% of the thickness of the strained silicon layer 106. In an exemplary embodiment of the present invention, the isolation layer 110 may include an oxide such as silicon oxide.

In the next fabrication step, a gate structure is formed on an isolation region of the strained silicon layer 106. The gate structure typically includes a gate oxide layer 112, a gate electrode 114, and a gate mask 116 sequentially formed on the isolation region of the strained silicon layer 106. In an exemplary embodiment of the present invention, the gate oxide layer 112 may be formed by a thermal oxidation process. The gate electrode 114 may include polysilicon or may have a polycide structure, i.e., a structure having a polysilicon layer and a metal silicide layer. Alternatively, the gate electrode 114 may include a metal such as tungsten (W).

A gate spacer 118 is formed on a sidewall of the gate structure. In an exemplary embodiment of the present invention, the gate spacer 118 may include a nitride, for example, silicon nitride.

Source/drain regions 120 are formed at second portions of the isolation region of the strained silicon layer so as to be adjacent to both sides of the gate structure. As depicted in FIG. 1, junction depths of the source/drain regions 120 may be substantially smaller than the overall thickness of the strained silicon layer 106.

The concentration of germanium in the second silicon germanium layer 104 of the present invention may be substantially lower than that typically found in a conventional semiconductor device. Therefore, the lattice dislocations caused by the lattice mismatches may be sufficiently decreased or minimized so that the crystalline structure of silicon in the strained silicon layer 106 will not be broken or damaged while, at the same time, the strained silicon layer 106 may be formed to a thickness of about 1,000 Å to about 5,000 Å. As a result, the isolation layer 110 may be positioned only in an inside portion of the strained silicon layer 106 so that a process for forming the trench 108 may be easily carried out, and a sidewall profile of the isolation layer 110 may also be improved. Additionally, the source/drain regions 120 may be positioned into the strained silicon layer 106 to an appropriate depth such that a failure of the semiconductor device (generated, for example, by diffusions of impurities) may be reduced or eliminated. Further, to the extent that lattice mismatches of the second silicon germanium layer 104 can be decreased, defects of the strained silicon layer 106 grown on the second silicon germanium layer 104 may thereby be reduced, and thus a leakage current of the semiconductor device formed on the strained silicon layer 106 may also be decreased. Therefore, a semiconductor device fabricated in accordance with exemplary embodiments of the present invention may exhibit such desirable characteristics as improved response speed, enhanced electrical characteristics, and excellent reliability.

FIG. 2 to FIG. 7 are schematic cross-sectional views illustrating a method of manufacturing a semiconductor device in accordance with an exemplary embodiment of the present invention.

Figure 2:
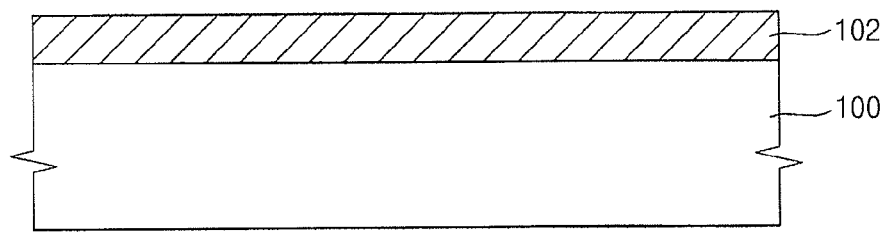
FIGS. 2 to 7 are schematic cross-sectional views illustrating a method of manufacturing a semiconductor device in accordance with an exemplary embodiment of the present invention.

Referring now to FIG. 2, a first silicon germanium layer 102 having a concentration gradient of germanium is formed on a single crystalline silicon substrate 100. The first silicon germanium layer 102 may be formed, for example, by an epitaxial growth process using an ultra-high vacuum chemical vapor deposition (UHV-CVD) apparatus.

The concentration of germanium in the first silicon germanium layer 102 may gradually increase from a lower portion of the first silicon germanium layer 102 to an upper portion of the first silicon germanium layer 102. Thus, the concentration of germanium in the first silicon germanium layer 102 may have a desired value at a top portion of the first silicon germanium layer 102, which is different from the concentration of germanium in a lower portion of layer 102. In the epitaxial growth process for forming the first silicon germanium layer 102, a flow rate of a germanium source gas provided onto the single crystalline silicon substrate 100 may be continuously increased at a controlled pace over the course of the growth process so as to form the first silicon germanium layer 102 having the desired concentration gradient of germanium. Particularly, the concentration of germanium at the top portion of the first silicon germanium layer 102 may preferably be in a range of about 1 percent by weight to about 15 percent by weight based on the total weight of the first silicon germanium layer 102. More preferably, the concentration of germanium at the top portion of the first silicon germanium layer 102 may be in a range of about 5 percent by weight to about 10 percent by weight.

Because single crystalline germanium may have a lattice parameter substantially larger than that of single crystalline silicon substrate on which the germanium layer is being formed, bonding distances between atoms in the first silicon germanium layer 102 may increase in accordance with increases in the concentration of germanium in the first silicon germanium layer 102. Additionally, lattice mismatches in the first silicon germanium layer 102 may increase in accordance with an augmentation in the concentration of germanium in the first silicon germanium layer 102. When the concentration of germanium at the top portion of the first silicon germanium layer 102 is maintained at a relatively low value, for example, in a range of about 1 percent by weight to about 15 percent by weight, the lattice mismatches in the first silicon germanium layer 102 may be thereby minimized, and thus dislocations in the first silicon germanium layer 102 may also be decreased.

Figure 3:
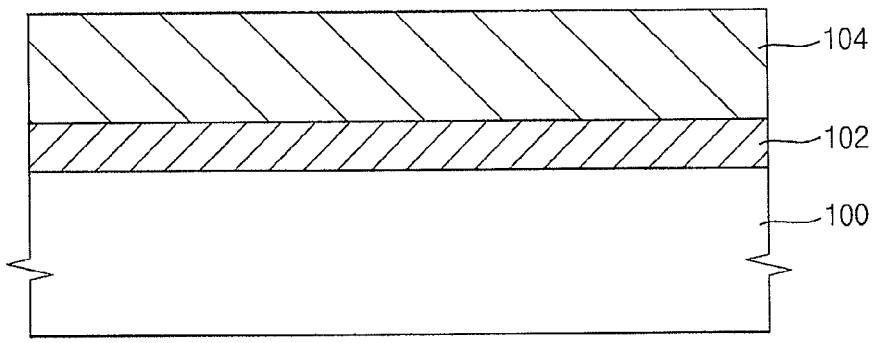

Referring now to FIG. 3, a second silicon germanium layer 104 is formed on the first silicon germanium layer 102. The second silicon germanium layer 104 may have a concentration of germanium that is substantially the same as the concentration of germanium at the top portion of the first silicon germanium layer 102. Thus, the concentration of germanium in the second silicon germanium layer 104 may preferably be in a range of about 1 percent by weight to about 15 percent by weight based on the total weight of the second silicon germanium layer 104.

The second silicon germanium layer 104 may be formed, for example, by an epitaxial growth process using an ultra-high vacuum chemical vapor deposition (UHV-CVD) apparatus. In an exemplary embodiment of the present invention, the first and the second silicon germanium layers, 102 and 104 respectively, may be formed in-situ.

Figure 4:
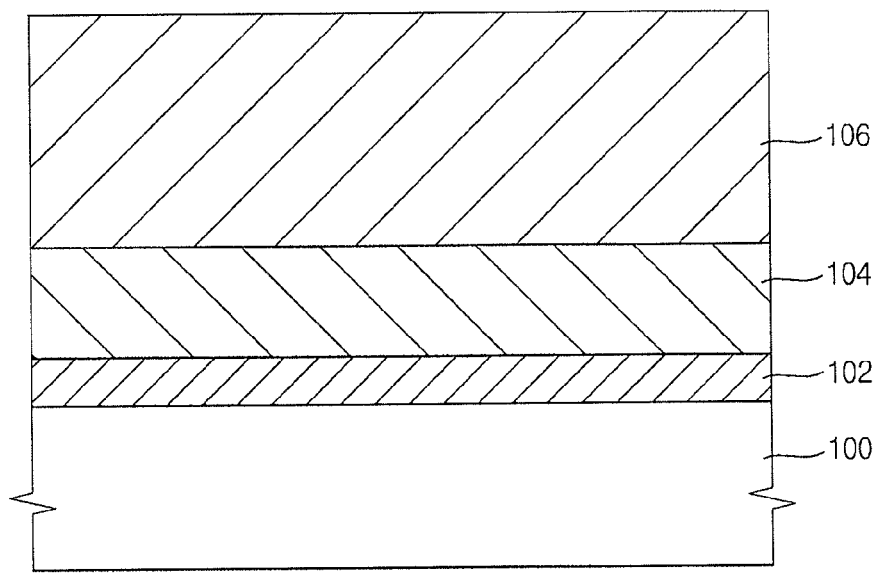

Referring now to FIG. 4, a strained silicon layer 106 is formed on the second silicon germanium layer 104. The strained silicon layer 106 will, for many common applications, be formed to have a thickness substantially thicker than that of an isolation layer 110 (see FIG. 6) that will subsequently be formed on the layer 106. The strained silicon layer 106 may be formed, for example, by an epitaxial growth process using an UHV-CVD apparatus. In an exemplary embodiment of the present invention, the first silicon germanium layer 102, the second silicon germanium layer 104 and the strained silicon layer 106 may be successively formed in-situ.

When the strained silicon layer 106 is grown by the epitaxial process using the second silicon germanium layer 104 as a seed layer, a lattice parameter of the strained silicon layer 106 thus formed may be substantially the same as that of the second silicon germanium layer 104. Therefore, a bonding distance between silicon atoms in the strained silicon layer 106 may be substantially larger than a normal bonding distance between silicon atoms, for example, in a conventional single crystalline silicon layer.

When the strained silicon layer 106 has a thickness greater than about 5,000 Å, however, a stress generated in the strained silicon layer 106 may increase during formation of the strained silicon layer 106 to the point that a strain relaxation in the strained silicon layer 106 may occur as a result of the crystalline structures of silicon atoms being broken. In this event, the bonding distance between silicon atoms in the thus damaged strained silicon layer 106 may be reduced. Further, there may be a substantial increase in the manufacturing time required for forming an excessively thick strained silicon layer 106.

On the other hand, when the strained silicon layer 106 has a thickness less than about 1,000 Å, the thickness required for forming an effective isolation layer 110 may be substantially the same as the thickness of the strained silicon layer 106, such that elements subsequently formed on the substrate 100 may not be effectively electrically isolated because the isolation layer 110 may not have a sufficient thickness. Therefore, the strained silicon layer 106 will ordinarily preferably have a thickness of about 1,000 Å to about 5,000 Å. To even more effectively achieve electrical isolation among the semiconductor elements by means of the isolation layers 110, the strained silicon layer 106 may preferably have a thickness of about 3,000 Å to about 5,000 Å.

Figure 5:
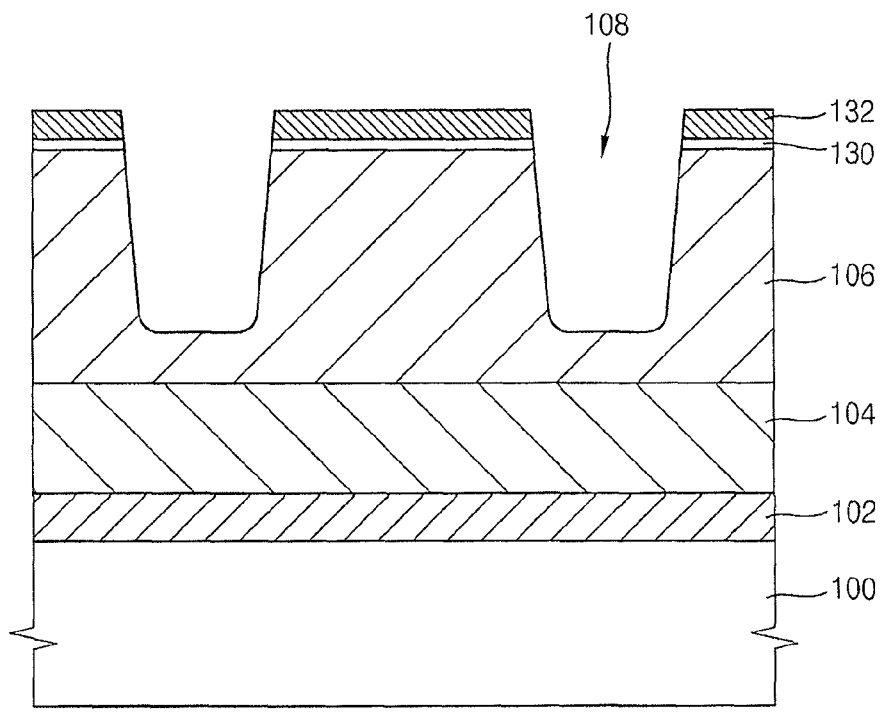

When the concentration of germanium in the second silicon germanium layer 104 is relatively high, the strained silicon layer 106 may advantageously have a relatively lower thickness in order to obtain desired crystalline characteristics of the strained silicon layer 106. For example, when the concentration of germanium in the second silicon layer 104 is increased to the high end of the recited range, i.e., to about 15 percent by weight, the thickness of the resulting strained silicon layer 106 may be reduced to about 1,000 Å. On the other hand, when the concentration of germanium in the second silicon layer 104 is kept at the low end of the recited range, i.e., about 1 percent by weight, the thickness of the strained silicon layer 106 may be increased to about 5,000 Å. In an exemplary embodiment of the present invention, when the concentration of germanium in layer 104 is about 5 percent by weight, the thickness of the strained silicon layer 106 may be about 4,000 Å. Referring next to FIG. 5, a buffer oxide layer (not shown) is formed on the strained silicon layer 106.

The buffer oxide layer may be formed, for example, through a thermal oxidation process. A hard mask layer (not shown) is then formed on the buffer oxide layer. The hard mask layer may be formed, for example, using a nitride such as silicon nitride.

The hard mask layer and the buffer oxide layer are then partially etched to form a hard mask pattern 132 (as seen in FIG. 5) and a buffer oxide layer pattern 130. The hard mask pattern 132 and the buffer oxide layer pattern 130 may be formed, for example, through a photolithography process.

The strained silicon layer 106 is then partially etched using the hard mask pattern 132 as an etching mask to thereby form trenches 108 along an upper portion of the strained silicon layer 106. During this step, the etching process may be controlled such that the second silicon germanium layer 104 is not exposed during formation of the trenches 108.

When one or more of the trenches 108 has a depth greater than about 90% of the thickness of the strained silicon layer 106, there is a risk that the second silicon germanium layer 104 may be exposed through the trenches 108 because a process margin of the etching process may be insufficient to protect the layer 104. Thus, the etching process for forming the trenches 108 will ordinarily preferably be carried out to form the trenches 108 having depths less than about 90% of the thickness of the strained silicon layer 106.

After formation of the trenches 108, a cleaning process may be executed on the substrate 100 and the structures formed thereon so as to remove reaction byproducts remaining, for example, in the insides of the trenches 108 and/or on the strained silicon layer 106. The cleaning process may be carried out using a conventional semiconductor cleaning solution. When the etching process and/or the cleaning process are completed, a portion of the hard mask pattern 132 that was used as the etching mask may be partially removed from the substrate 100.

As noted above, in a preferred embodiment of this invention, the formation of the trenches 108 is carried out such that the second silicon germanium layer 104 is not exposed. In this case, the choice of etching conditions and the selection of an etching solution or an etching gas for etching the strained silicon layer 106 may be made without concern about possible damage to exposed portions of the layer 104. That is, because the etching conditions and the etching solution or the etching gas may be optimized for etching the strained silicon layer 106, without concern about the layer 104, the etching process for forming the trenches 108 may be simplified. Additionally, sidewall profiles of the trenches 108 may be improved by being able to optimize the etching conditions.

Figure 6:
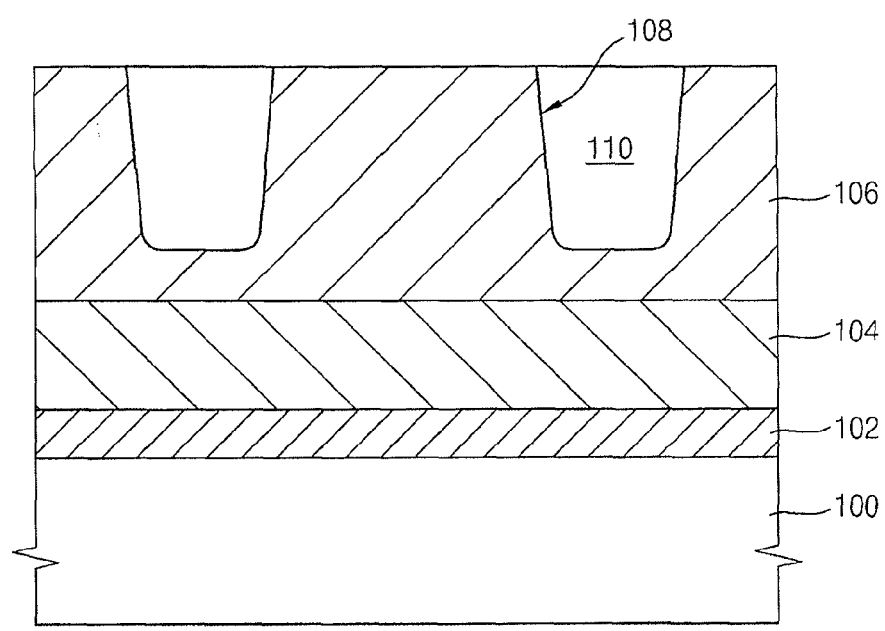

Referring now to FIG. 6, an insulation layer (not shown) is formed on the strained silicon layer 106 so as to fill up the trenches 108. The insulation layer may be formed using an oxide such as silicon oxide. The insulation layer is then partially removed until the upper surface of strained silicon layer 106 is exposed such that the isolation layers 110 are formed in the trenches 108, respectively so as to define an isolation region on the upper surface of layer 106. After formations of the isolation layers 110, the remaining portions of hard mask pattern 132 and the underlying buffer oxide layer 130 are removed from the strained silicon layer 106. Each of the isolation layers 110 in the trenches 108 may preferably have a thickness that is less than about 90% of the depth of the strained silicon layer 106.

Figure 7:
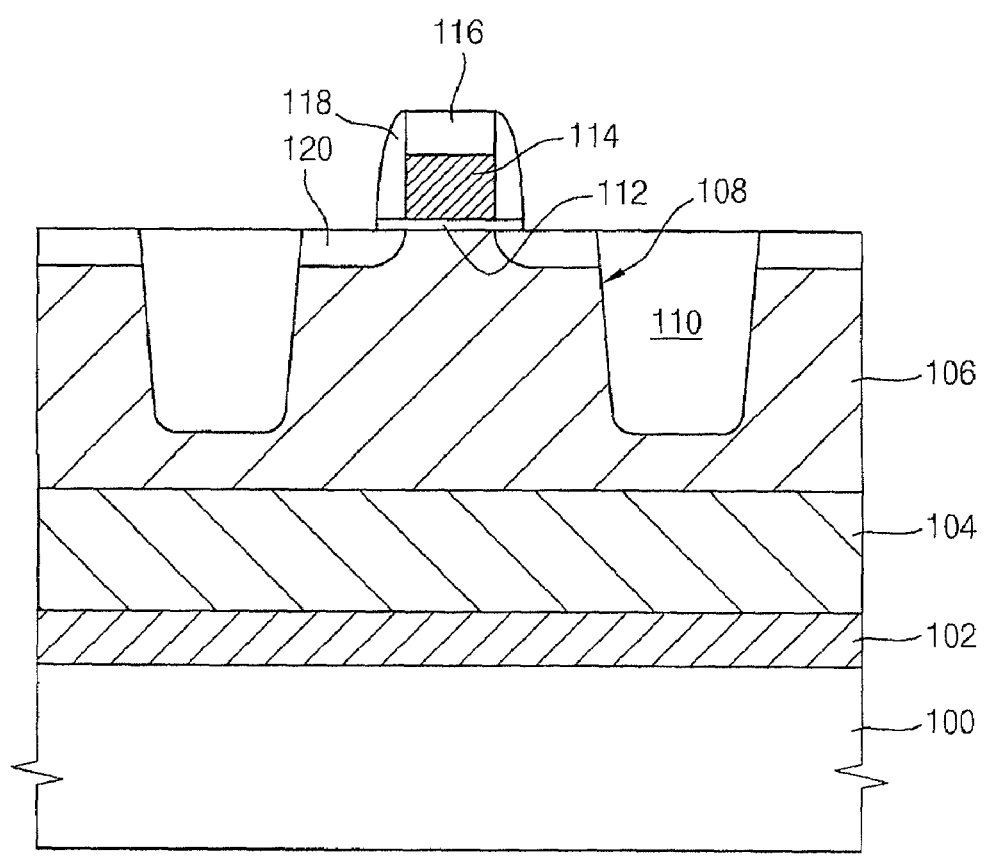

Referring now to FIG. 7, a gate structure is formed on a portion of the strained silicon layer 106 in the isolation region between the isolation layers 110. The gate structure includes a gate oxide layer 112 formed on the surface of the layer 106, a gate electrode 114 formed on the gate oxide layer, a gate mask 116 formed on the gate electrode, and a gate spacer 118 formed along sides of the gate electrode and gate mask. The gate oxide layer 112 is formed on the strained silicon layer 106. The gate oxide layer 112 may be formed, for example, through a thermal oxidation process. A gate conductive layer (not shown) and a gate mask layer (not shown) are then sequentially formed on the gate oxide layer 112.

The gate conductive layer may be formed, for example, using polysilicon doped with impurities or polysilicon and metal silicide. Alternatively, the gate conductive layer may be formed using a metal such as tungsten (W). The gate mask layer may be formed, for example, using a nitride such as silicon nitride.

The gate electrode 114 and the gate mask 116 are formed on the gate oxide layer 112 by partially etching the gate conductive layer and the gate mask layer. Each of the gate electrode 114 and the gate mask 116 may have a width substantially narrower than that of the gate oxide layer 112 as depicted in FIG. 7.

A nitride layer (not shown) is then formed on the strained silicon layer 106 so as to cover the gate electrode 114 and the gate mask 116. The nitride layer may be formed, for example, using silicon nitride. The nitride layer is then anisotropically etched to form the gate spacer 118 on sidewalls of the gate electrode 114 and the gate mask 116. A lower portion of the gate spacer 118 may be positioned on the gate oxide layer 112, as depicted in FIG. 7.

Source/drain regions 120 are formed along portions of the strained silicon layer 106 which are adjacent to the gate structure. The source/drain regions 120 may be formed, for example, by implanting impurities into the portions of the strained silicon layer 106 which are adjacent to the gate structure. Each of the source/drain regions 120 may have a junction depth that is substantially smaller than the thickness of the strained silicon layer 106. Once the source/drain regions 120 are formed, the structure thus formed can function as a transistor having the gate structure and the source/drain regions 120 as described above formed on the strained silicon layer 106.

If the impurities for forming the source/drain regions 120 are being implanted into both the second silicon germanium layer 104 and the strained silicon layer 106, these impurities may be more rapidly diffused in the second silicon germanium layer 104, than in the strained silicon layer 106. Accordingly, in exemplary embodiments of the present invention, it is preferred that the impurities for forming the source/drain regions 120 not also be implanted into the second silicon germanium layer 104. Because the source/drain regions 120 may have junction depths substantially smaller than the thickness of the strained silicon layer 106, through careful control of the implantation step, it is possible to avoid implantation into layer 104. Thus, failures of the source/drain regions 120 caused by excessive diffusions of the impurities into layer 104 may be effectively prevented.

The transistor formed according to exemplary embodiments of the present invention may demonstrate improved response speed and electrical characteristics in comparison with a conventional transistor formed on a usual single crystalline silicon substrate because a mobility of electrons or holes on the transistor of the present invention may be considerably enhanced. Additionally, the transistor of the present invention may include source/drain regions exactly formed at desired positions, and also adjacent transistors may be efficiently electrically isolated in comparison with a conventional transistor formed on a usual strained silicon layer. As a result, a transistor according to exemplary embodiments of the present invention may have improved reliability, and a leakage current generated from the transistor may be greatly reduced.

Figure 8:
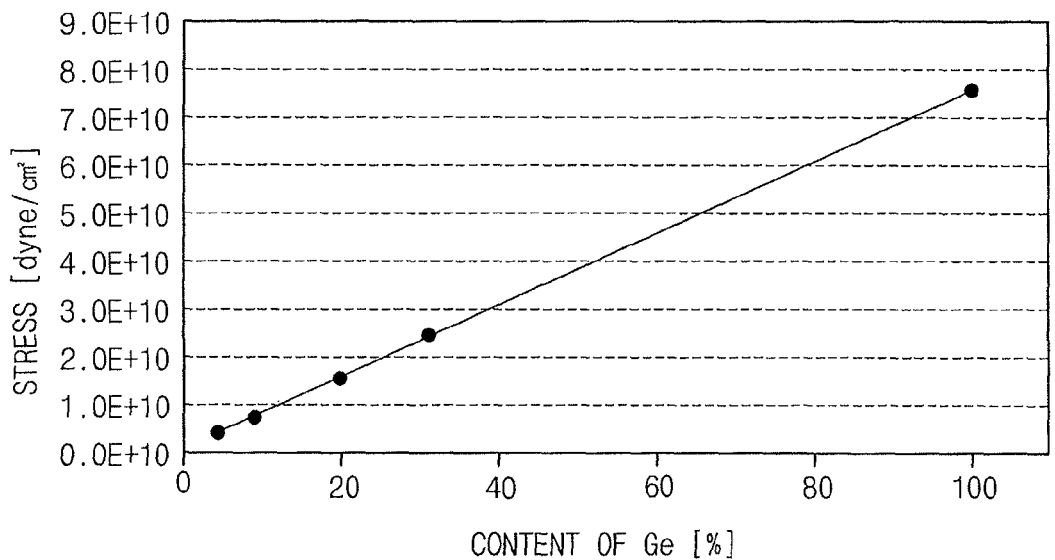
FIG. 8 is a graph illustrating stress levels in strained silicon layers formed on silicon germanium layers plotted against the germanium content of the silicon germanium layers.

Measurement of Stress in a Strained Silicon Layer Relative to a Concentration of Germanium in an Underlying Layer FIG. 8 is a graph illustrating how stresses in strained silicon layers formed on silicon germanium layers vary according to the concentration of germanium in the underlying silicon germanium layers.

Referring to FIG. 8, it can be seen that the stresses generated in the strained silicon layers vary directly in accordance with the concentration of germanium in the silicon germanium layers. That is, as the concentration of germanium the silicon germanium layers increase, lattice parameters of the strained silicon layers also increase. As a result, bonding distances between silicon atoms in the strained silicon layers increase so that the stresses in the strained silicon layers increase, too. Further, when a concentration of germanium in a strained silicon layer according to the present invention is in a preferred range of about 1 percent by weight to about 15 percent by weight, a stress generated in the strained silicon layer has a correspondingly relative low value below about $1.3 \times 10^{10}$ dyne/cm$^2$.

Figure 9:
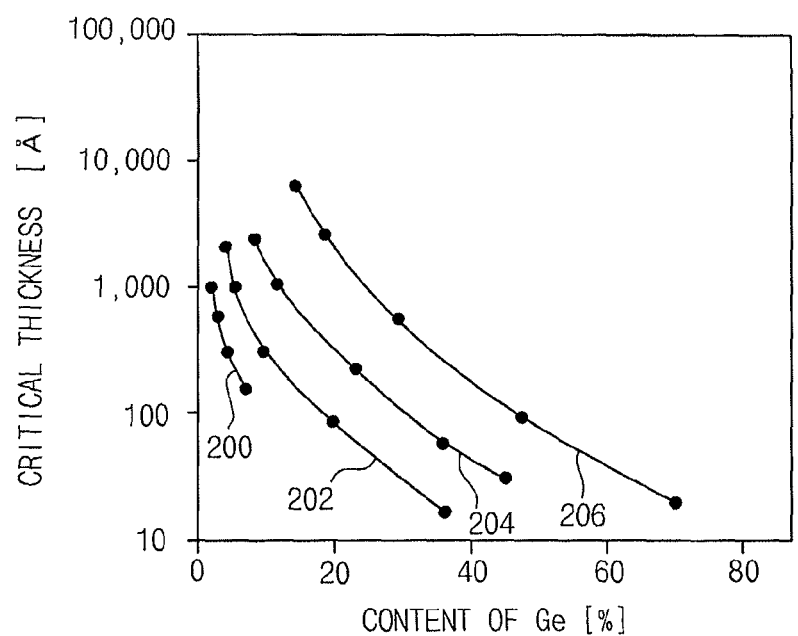
FIG. 9 is a graph illustrating critical thicknesses of strained silicon layers formed on silicon germanium layers plotted against the germanium content of the silicon germanium layers and also relative to process temperatures used for forming the strained silicon layers.

Measurement of a Critical Thickness of a Strained Silicon Layer Relative to a Concentration of Germanium in an Underlying Layer and a Formation Temperature of the Strained Silicon Layer FIG. 9 is a graph illustrating the variation in critical thicknesses of strained silicon layers formed on silicon germanium layers in accordance with changes in the concentration of germanium in the silicon germanium layers, and also relative to process temperatures for forming the strained silicon layers.

In FIG. 9, reference numeral 200 represents the plot of critical thicknesses of strained silicon layers formed by an epitaxial growth process carried out at a temperature of about 900° C.; reference numeral 202 denotes the plot of critical thicknesses of strained silicon layers formed by an epitaxial growth process carried out at a temperature of about 750° C.; reference numeral 204 represents the plot of critical thicknesses of strained silicon layers formed by an epitaxial growth process carried out at a temperature of about 650° C.; and reference numeral 206 represents the plot of critical thicknesses of strained silicon layers formed by an epitaxial growth process carried out at a temperature of about 550° C.

As shown in FIG. 9, when the strained silicon layers are formed at a substantially identical process temperature, the critical thicknesses of the strained silicon layers vary inversely with the concentration of germanium in the silicon, germanium layers, i.e., the critical thicknesses are reduced as the concentration of germanium in the silicon germanium layers increases. When the strained silicon layers are grown on silicon germanium layers having substantially identical concentration of germanium, the critical thicknesses of the strained silicon layers increase as the process temperature is reduced.

As described above, a strained silicon layer having a desired thickness may be formed by controlling a concentration of germanium in a silicon germanium layer positioned beneath the strained silicon layer and by adjusting a process temperature of an epitaxial growth process. Particularly, in exemplary embodiments of the present invention, the strained silicon layer may have a thickness of about 1,000 Å to about 10,000 Å, more preferably about 1,000 Å to about 5,000 Å, and even more preferably about 3,000 Å to about 5,000 Å, by controlling the process temperature of the epitaxial growth process when the concentration of germanium in the underlying silicon germanium layer is in a range of about 1 percent by weight to 15 percent by weight. When the strained silicon layer has a sufficient thickness, an isolation layer and source/drain regions may be selectively formed on and in the strained silicon layer.

EXAMPLE 1

A first NMOS transistor was formed in accordance with this invention on a strained silicon layer positioned on a single crystalline silicon substrate. The first NMOS transistor included a gate electrode having a length of about 10 μm and a width of about 10 μm.

EXAMPLE 2

A second NMOS transistor was formed in accordance with this invention on a strained silicon layer positioned on a single crystalline silicon substrate. The second NMOS transistor included a gate electrode having a length of about 10 μm and a width of about 1 μm.

Comparative Example 1

A third NMOS transistor was formed directly on a single crystalline silicon substrate. The third NMOS transistor included a gate electrode having a length of about 10 μm and a width of about 10 μm (i.e., comparable in size to the first NMOS transistor).

Comparative Example 2

A fourth NMOS transistor was formed directly on a single crystalline silicon substrate. The fourth NMOS transistor included a gate electrode having a length of about 10 μm and a width of about 1 μm (i.e., comparable in size to the second NMOS transistor).

Measurement of Charge Mobility of NMOS Transistors According to Example 1 and Comparative Example 1

The first NMOS transistor of Example 1 was formed in accordance with this invention on a strained silicon layer, whereas the third NMOS transistor of Comparative Example 1 was directly formed on a single crystalline silicon substrate.

Figure 10:
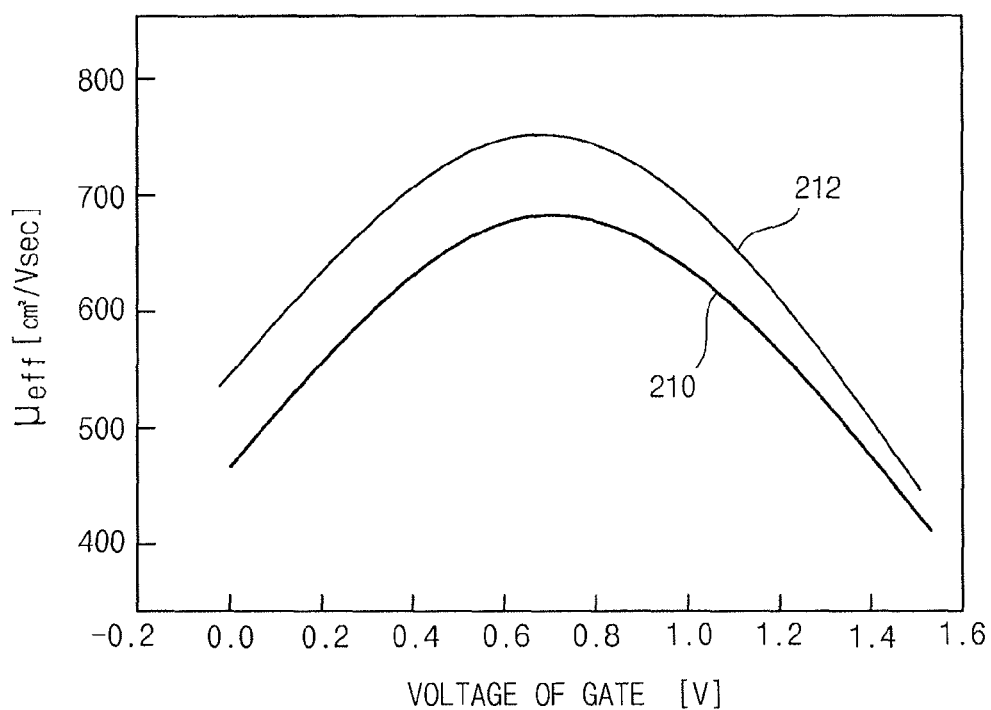
FIG. 10 is a graph illustrating mobility of electrons in the NMOS transistors of Example 1 (described below) and Comparative Example 1 relative to gate voltages.

FIG. 10 is a graph illustrating mobility of electrons in the NMOS transistors of Example 1 and Comparative Example 1 relative to gate voltages. In FIG. 10, reference numeral 210 represents the mobility of the electrons in the third NMOS transistor of Comparative Example 1, and reference numeral 212 represents the mobility of the electrons in the first NMOS transistor of Example 1.

Referring to FIG. 10, it can readily be seen that the NMOS transistor of Example 1 in accordance with this invention has an electron mobility that is consistently and substantially higher (by about 15%) than that of the third NMOS transistor of Comparative Example 1.

Measurement of Currents of NMOS Transistors According to Example 2 and Comparative Example 2

On-currents and off-currents were measured relative to the NMOS transistors of Example 2 and Comparative Example 2. The second NMOS transistor of Example 2 was formed on a strained silicon layer in accordance with this invention whereas the fourth NMOS transistor of Comparative Example 2 was directly formed on a single crystalline silicon layer.

Figure 11:
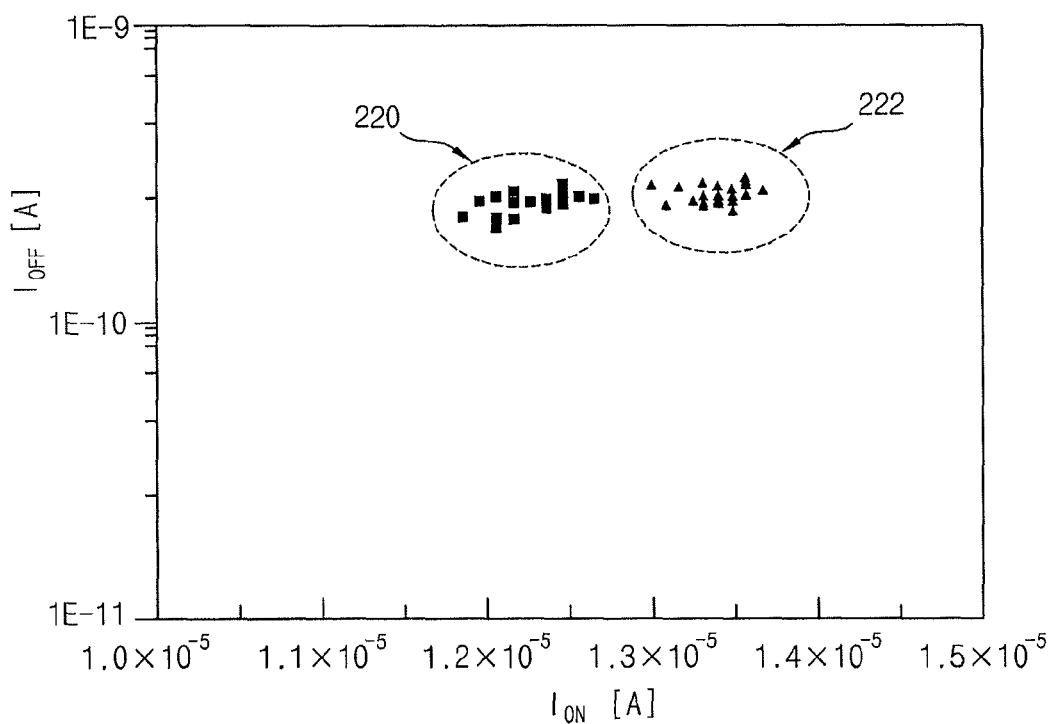
FIG. 11 is a graph illustrating off-currents and on-currents of the NMOS transistors according to Example 2 (described below) and Comparative Example 2.

FIG. 11 is a graph plotting off-currents (along the y-axis) and on-currents (along the x-axis) for the NMOS transistors according to Example 2 and Comparative Example 2.

In FIG. 11, the on-currents were measured by applying operation voltages to gate electrodes and power sources Vcc, and the off-currents were measured by applying voltages of 0V to the gate electrodes and by applying operation voltages to the power sources. In FIG. 11, reference numeral 220 denotes the off-current and the on-current characteristics for the fourth NMOS transistor of Comparative Example 2, and reference numeral 222 represents the off-current and the on-current characteristics for the second NMOS transistor of Example 2.

Referring to FIG. 11, it can be seen that the off-current for the second NMOS transistor of Example 2 is substantially similar to that of the fourth NMOS transistor of Comparative Example 2. On the other hand, the on-current characteristics for the second NMOS transistor of Example 2 are consistently higher than the on-current characteristics of the NMOS transistor of Comparative Example 2 by about 10%.

Therefore, it can be concluded that the NMOS transistor of Example 2 in accordance with this invention has higher on-current characteristics than that of the NMOS transistor of Comparative Example 2, even though the NMOS transistor of Example 2 may have a leakage current level that is substantially similar to that of the NMOS transistor of Comparative Example 2.

According to the present invention, a semiconductor device such as a transistor may have improved response speed because the semiconductor device is formed on a strained silicon layer. Additionally, an isolation layer may be formed to have a proper thickness so that a failure of the semiconductor device may be reduced or avoided. As a result, a yield of the semiconductor device may be improved and also electrical characteristics and reliability of the semiconductor device may be enhanced.

The foregoing description is illustrative of the present invention and is not to be construed as limiting thereof. Although a few exemplary embodiments of the present invention have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of manufacturing a semiconductor device comprising steps of:
   forming a first silicon germanium layer on a single crystalline silicon substrate, wherein the first silicon germanium layer has a concentration gradient of germanium;
   forming a second silicon germanium layer on the first silicon germanium layer, wherein the second silicon germanium layer has a concentration of germanium in a range of about 1 percent by weight to about 15 percent by weight based on the total weight of the second silicon germanium layer;
   forming a strained silicon layer on the second silicon germanium layer;
   forming an isolation layer at a first portion of the strained silicon layer to define an isolation region;
   forming a gate structure on the isolation region of the strained silicon layer; and
   forming source/drain regions at second portions of the strained silicon layer adjacent to the gate structure.

2. The method of claim 1, wherein the first silicon germanium layer is formed by an epitaxial growth process to provide a concentration gradient of germanium that gradually increases from a lower portion of the first silicon germanium layer to an upper portion of the first silicon germanium layer.

3. The method of claim 1, wherein the concentration of germanium in a top portion of the first silicon germanium layer is substantially the same as that in the second silicon germanium layer.

4. The method of claim 1, wherein the source/drain regions are formed by an ion implantation process to have junction depths substantially smaller than a thickness of the strained silicon layer.

5. The method of claim 1, wherein the strained silicon layer is formed to a thickness of about 1,000 Å to about 5,000 Å.

6. The method of claim 1, wherein the steps of forming the isolation layer further comprises steps of:
   forming a buffer oxide layer pattern and a hard mask pattern on the strained silicon layer;
   forming a trench at an upper portion of the strained silicon layer by partially etching the strained silicon layer using the hard mask pattern as an etching mask; and
   forming the isolation layer to fill up the trench.

7. The method of claim 6, further comprising a step of cleaning the strained silicon layer using a cleaning solution after the isolation layer has been formed.

8. The method of claim 6, wherein the isolation layer is formed to have a thickness less than about 90% of a thickness of the strained silicon layer.

* * * * *